(12) United States Patent
Shin

(10) Patent No.: US 6,850,108 B2
(45) Date of Patent: Feb. 1, 2005

(54) INPUT BUFFER

(75) Inventor: Soon-Kyun Shin, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/670,856

(22) Filed: Sep. 25, 2003

(65) Prior Publication Data

US 2004/0113676 A1 Jun. 17, 2004

(30) Foreign Application Priority Data

Dec. 12, 2002 (KR) ................................ 10-2002-0079348

(51) Int. Cl.[7] ................................................. H03K 5/08
(52) U.S. Cl. ....................... 327/319; 327/321; 327/333; 326/82; 326/83
(58) Field of Search .................................. 327/309, 318, 327/319, 321, 327, 328, 333, 108, 112, 379, 389, 391; 326/81–83, 86

(56) References Cited

U.S. PATENT DOCUMENTS 5,381,062 A * 1/1995 Morris ........................... 326/68
6,137,313 A * 10/2000 Wong et al. .................. 326/83
6,529,060 B2 * 3/2003 Jung ............................ 327/333
6,573,765 B2 * 6/2003 Bales et al. .................. 327/108

* cited by examiner

Primary Examiner—Tuan T. Lam
(74) Attorney, Agent, or Firm—Mills & Onello LLP

(57) ABSTRACT

An input buffer comprises: a pull-up transistor connected between a power supply voltage and an input pad and having a gate to which a control voltage is applied, and a substrate to which a floating well voltage is applied; a transmission transistor having a gate to which the power supply voltage is applied and a substrate connected to a ground voltage, and transmitting a signal applied to the input pad; a buffer generating an input signal by buffering the signal applied to the transmission transistor; and a control circuit generating a voltage applied to the input pad as the control voltage and the floating well voltage when a high voltage is applied to the input pad, generating the ground voltage as the control voltage and the power supply voltage as the floating well voltage in the case where a voltage less than the high voltage is applied to the input pad. In this manner, it is possible to prevent leakage current through the input buffer connected to the input pad of an external device by pulling up the input pad to the power supply voltage level, when the input pad is in floating state; while protecting the pull-up transistor from the high voltage by turning off the pull-up transistor in the case where the high voltage is applied to the input pad.

12 Claims, 4 Drawing Sheets

INPUT BUFFER

This U.S. patent application claims priority under 35 U.S.C. § 119 to Korean Patent Application 2002-79348 filed on Dec. 12, 2002, the entire content of which is hereby incorporated by reference.

BACKGROUND OF THE INVENTION

1. Field of the Invention

The present invention generally relates to an input buffer, and more specifically, to an input buffer having a pull-up means.

2. Description of Related Art

Owing to the development of process technology, semiconductor devices having a power supply voltage lower than 3.3V can be achieved using deep-submicron line width technology. However, the power supply voltage of external systems that communicate with such devices commonly operate at a voltage, such as 5V, that is higher than the power supply voltage within the semiconductor device.

Thus, input circuits of the semiconductor device commonly include a high-voltage tolerant function such that device can operate stably, irrespective of the applied external voltage level.

Generally, an input circuit of the semiconductor device indicates an input buffer that buffers a signal input at a chip pad.

An input buffer having a conventional pull-up means buffers the signal input at the pad, and pulls up the pad by the pull-up means when the pad is in a floating state.

However, the input buffer having the conventional pull-up means does not pull up the pad to the power supply voltage level by the pull-up means in the case where the pad is in the floating state, and instead pulls it up to a voltage of the power supply voltage minus a threshold voltage. Accordingly, an input buffer receiving a signal from an external device connected to the pad of the semiconductor device is turned on, causing leakage current through the input buffer.

FIG. 1 is a circuit diagram of an embodiment of an input buffer having a conventional pull-up means. The pull-up means comprises an NMOS transistor N1, a PMOS transistor P1, and a buffer BUF1.

In FIG. 1, reference numeral 10 shows a pad.

The operation of the circuit illustrated in FIG. 1 is as follows.

The NMOS transistor N1 is always turned on. When a signal of a ground voltage level is applied to the pad 10, the signal of the ground voltage level is transmitted to a node n. In the case where a signal of a high voltage level, or a power supply voltage level, is applied, the voltage transmitted to node n is one of the high voltage minus the threshold voltage Vtn of the NMOS transistor N1 or the power supply voltage VDD minus the threshold voltage Vtp of the NMOS transistor N1 VDD-Vtn. That is, the NMOS transistor N1 performs a high-voltage tolerant function. The buffer BUF1 generates an input signal IN by buffering the signal applied to the node n. In such an operation, the PMOS transistor P1 is configured to not influence the voltage of the node n.

When the pad 10 is in floating state, the PMOS transistor P1 pulls up the node n to the power supply voltage VDD level. The NMOS transistor N1 transmits the voltage VDD-Vtn subtracting the threshold voltage Vtn of the NMOS transistor N1 from the power supply voltage VDD to the pad 10. That is, the pad 10 is not fully pulled up to the power supply voltage VDD level, and is pulled up to the voltage VDD-Vtn, subtracting the threshold voltage Vtn of the NMOS transistor N1 from the power supply voltage VDD. Therefore, the pad 10 is prevented from being in floating state by the PMOS transistor P1.

However, since the pad 10 is pulled up to the voltage of VDD-Vtn, subtracting the threshold voltage Vtn of the NMOS transistor N1 from the power supply voltage VDD, an input buffer connected to a pad of an external device connected to the pad 10 is turned on, causing a leakage current through the input buffer connected to the pad of the external device.

Of course, if the input buffer is configured by directly connecting the PMOS transistor P1 with the pad 10, it is possible to pull up the pad 10 to the power supply voltage level in the case where the pad 10 is in the floating state. However, in such a configuration, if a high voltage is applied to the pad 10, this configuration can cause a very large voltage difference to be applied between a gate and a drain of the PMOS transistor P1, thereby allowing for damage to the gate oxide of the PMOS transistor P1.

SUMMARY OF THE INVENTION

It is therefore an object of the present invention to provide an input buffer capable of pulling up a pad at a power supply voltage level when the pad is in a floating state and protecting the pull-up means in the event that a high voltage signal is applied to the pad.

To accomplish the above object, the input buffer of the present invention comprises: a pull-up transistor connected between a power supply voltage and an input pad and having a gate to which a control voltage is applied and a substrate to which a floating well voltage is applied; a transmission transistor having a gate to which the power supply voltage is applied and a substrate connected to a ground voltage, and transmitting a signal applied to the input pad; a buffer generating an input signal by buffering the signal transmitted by the transmission transistor; and a controller generating a voltage of the signal applied to the input pad as the control voltage and the floating well voltage when a high voltage is applied to the input pad, generating the ground voltage as the control voltage and the power supply voltage as the floating well voltage in the case where a voltage less than the high voltage is applied to the input pad.

The controller comprises: a high voltage detecting circuit generating a high voltage detecting signal when the high voltage is applied to the input pad; a high voltage detecting reset circuit generating a high voltage detecting reset signal for resetting the high voltage detecting signal in case the voltage less than the high voltage is applied to the input pad; and a control voltage and floating well voltage generating circuit generating the voltage applied to the input pad as the control voltage and the floating well voltage when the high voltage detecting signal is generated, and generating the ground voltage as the control voltage and the power supply voltage as the floating well voltage in case the high voltage detecting signal is reset, In one example, the high voltage is a voltage greater than the power supply voltage.

BRIEF DESCRIPTION OF THE DRAWINGS

Exemplary embodiments of the present invention will be readily apparent to those of ordinary skill in the art upon review of the detailed description that follows when taken in conjunction with the accompanying drawings, in which like reference numerals denote like parts, and in which.

DETAILED DESCRIPTION OF PREFERRED EMBODIMENTS

Reference will now be made in detail to exemplary embodiments of the present invention, which are illustrated in the accompanying drawings.

Hereinafter, the input buffer of the present invention will be more fully described in reference to the accompanying drawings.

Figure 1:
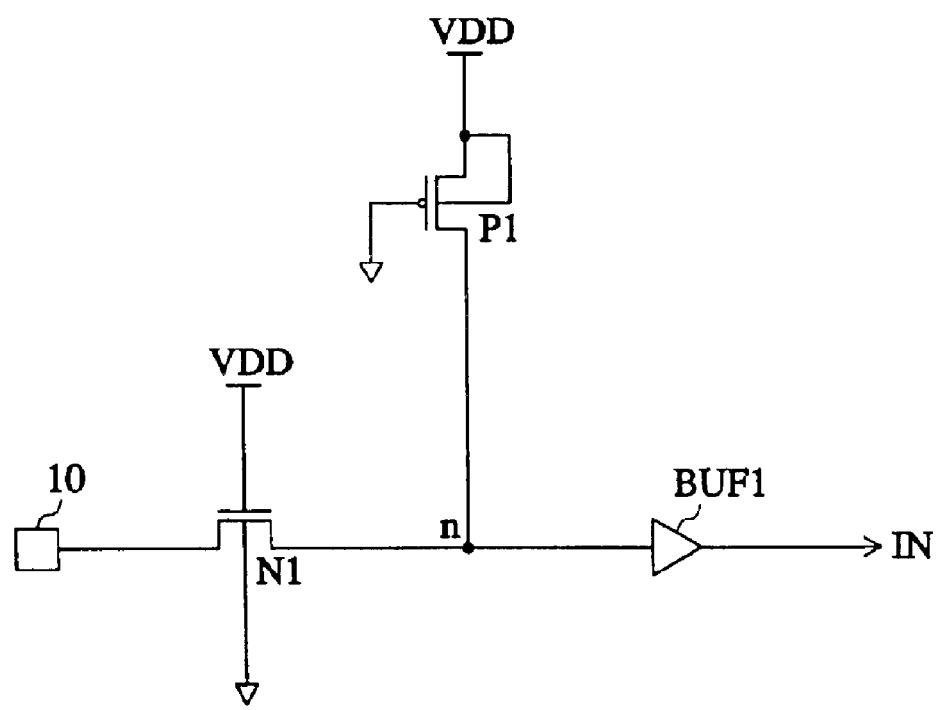
FIG. 1 is a circuit diagram of an embodiment of an input buffer having a conventional pull-up means.
Figure 2:
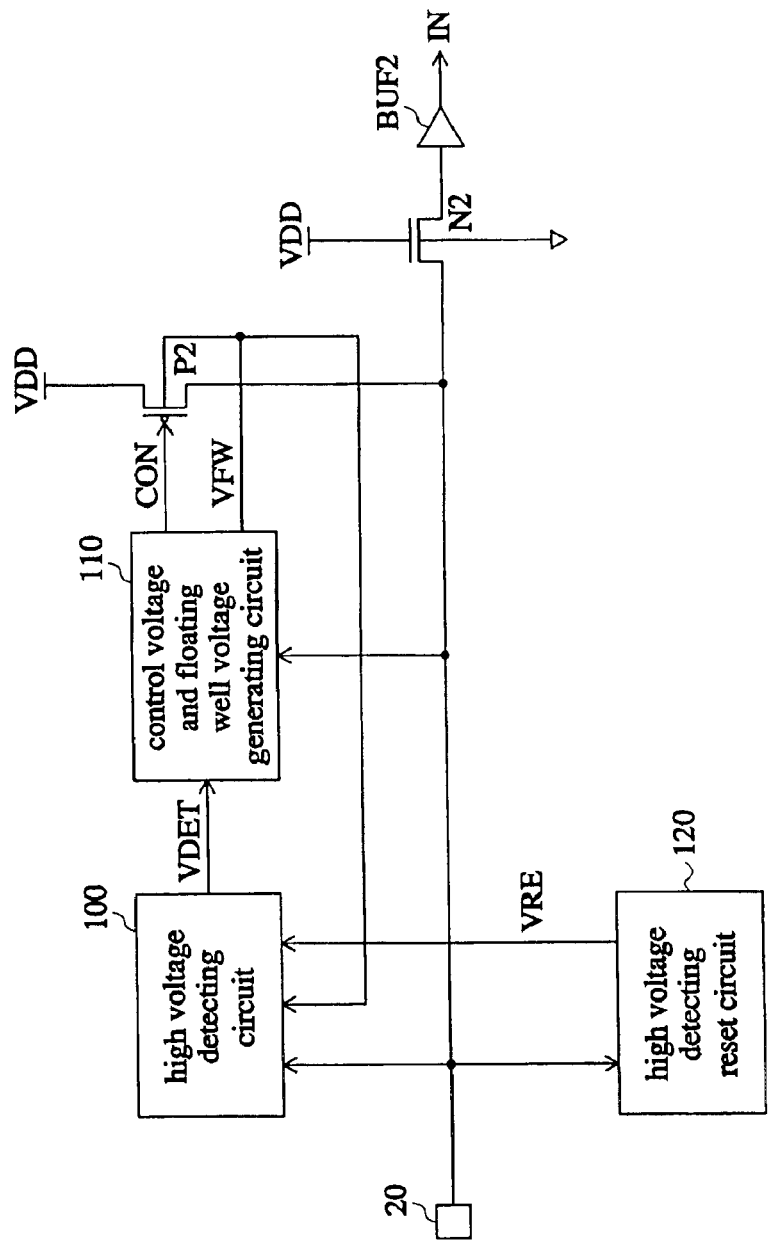
FIG. 2 illustrates a configuration of an embodiment of an input buffer in accordance with the present invention.

FIG. 2 illustrates a configuration of an embodiment of an input buffer in accordance with the present invention, comprising a high voltage detecting circuit 100, a control voltage and floating well voltage generating circuit 110, a high voltage detecting reset circuit 120, a PMOS transistor P2, a NMOS transistor N2, and a buffer BUF2.

In FIG. 2, reference numeral 20 refers to a chip pad.

The function of the configuration shown in FIG. 2 will be described as follows.

When a voltage at a level greater than a power supply voltage VDD level is applied to the pad 20 while a floating well voltage VFW is applied, the high voltage detecting circuit 100 generates a high voltage detecting signal VDET and resets the high voltage detecting signal VDET in response to a high voltage reset signal VRE.

The control voltage and floating well voltage generating circuit 110 generates a voltage applied to the pad 20 as the floating well voltage VFW and a control voltage CON in the case where the high voltage detecting signal VDET is generated, and the circuit 110 generates the power supply voltage VDD as the floating well voltage VFW and a ground voltage as the control voltage CON in the case where the high voltage detecting signal VDET is reset, If the voltage applied to the pad 20 is not greater than the power supply voltage VDD level, the high voltage detecting reset circuit 120 generates the high voltage detecting reset signal VRE.

The PMOS transistor P2 is turned off when the floating well voltage VFW and the control voltage CON are applied to the pad 20, and is turned on in the case where the floating well voltage VFW is the power supply voltage VDD and the control voltage CON is the ground voltage, thereby pulling up the pad 20 to the power supply voltage VDD level. The NMOS transistor N2 transmits the voltage applied to the pad 20. That is, if the voltage applied to the pad 20 is lower than the power supply voltage VDD level, the NMOS transistor N2 transmits the applied voltage to the pad 20, and if the voltage applied to the pad 20 is greater than the power supply voltage VDD level, the NMOS transistor N2 transmits a voltage equal to the difference between the threshold voltage Vtn of the NMOS transistor N2 minus the voltage applied to the pad 20. If the level of the signal transmitted through the NMOS transistor N2 reaches the trip voltage of the buffer BUF2, the buffer BUF2 transits the level of the input signal IN.

As shown in FIG. 2, the input buffer of the present invention is configured by connecting the PMOS transistor P2, which is a pull-up means, to the pad 20, and comprises the high voltage detecting circuit 100, the control voltage and floating well voltage generating circuit 110, and the high voltage detecting reset circuit 120 for protecting the PMOS transistor P2 in the case where a voltage greater than the power supply voltage VDD level is applied to the pad.

That is, in order to protect the PMOS transistor P2 from the applied high voltage, the input buffer of the present invention turns off the PMOS transistor P2 when the high voltage that is greater than the power supply voltage VDD level is applied to the pad 20, and pulls up the pad 20 to the power supply voltage VDD level by turning on the PMOS transistor P2 in the case where a voltage between a ground voltage level and the power supply voltage VDD level is applied to the pad 20. Consequently, it is possible to remove a leakage current through the input buffer connected to a pad of an external device by pulling up the pad 20 to the power supply voltage VDD level when the pad 20 is in a floating state.

Figure 3:
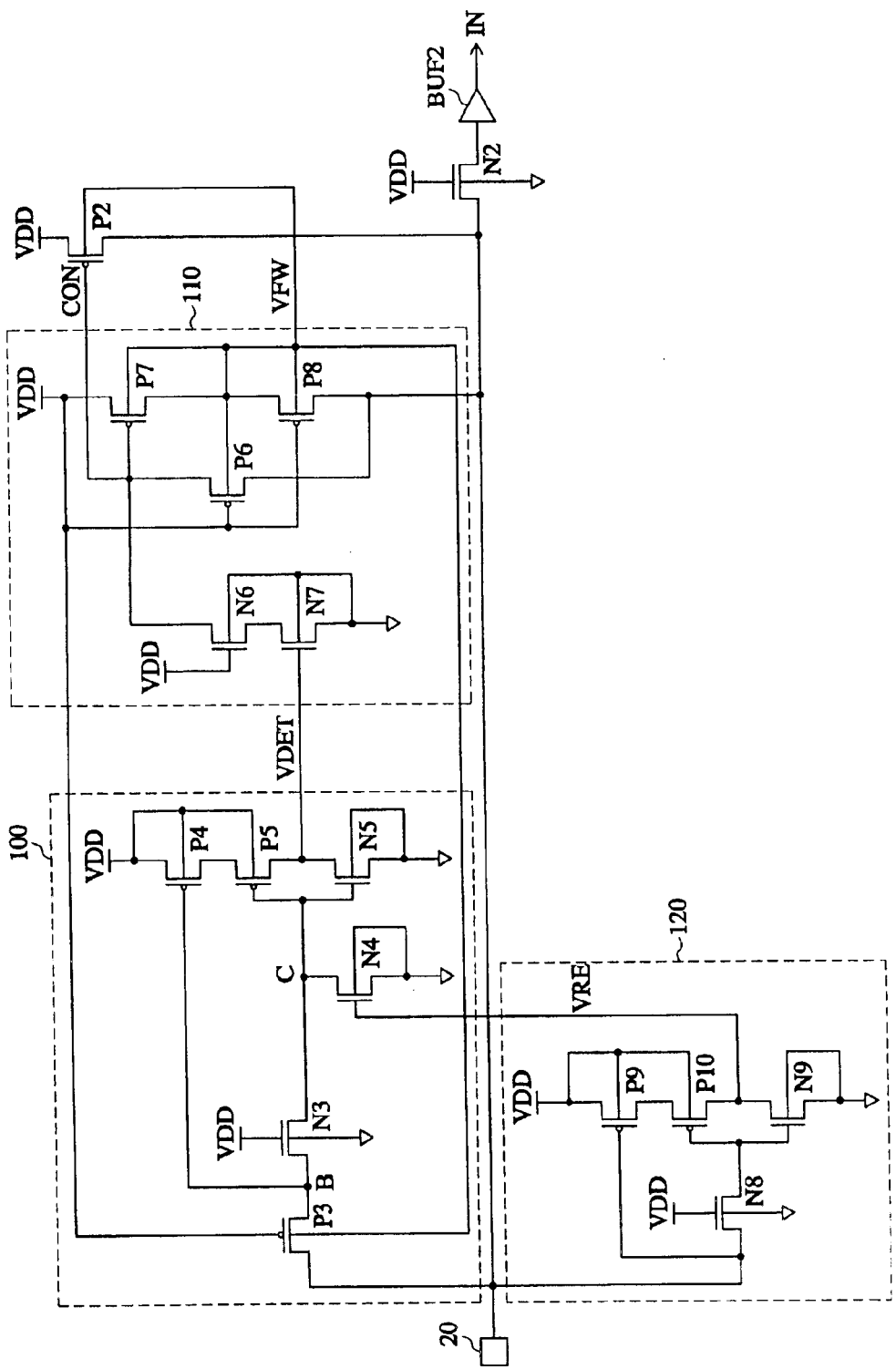
FIG. 3 is a circuit diagram of an embodiment of an input buffer in accordance with the present invention.

FIG. 3 is a circuit diagram of an embodiment of an input buffer in accordance with the present invention. In this embodiment, the high voltage detecting circuit 100 comprises PMOS transistors P3, P4, and P5 and NMOS transistors N3, N4, and N5, the control voltage and floating well voltage generating circuit 110 comprises PMOS transistors P7, P8, and P9 and NMOS transistors N6 and N7, and a high voltage detecting reset circuit 120 comprises PMOS transistors P9 and P10 and NMOS transistors N8 and N9.

The configuration of the circuit shown in FIG. 3 is now more fully described as follows.

The high voltage detecting circuit 100 comprises: PMOS transistor P3 connected between the pad 20 and a node B and having a gate to which a power supply voltage VDD is applied, and a substrate to which a floating well voltage VFW is applied; the NMOS transistor N3 connected between the node B and a node C and having a gate to which the power supply voltage VDD is applied and a substrate to which a ground voltage is applied; the NMOS transistor N4 having a drain connected to the node C, a gate to which a high voltage detecting reset signal VRE is applied, and a source connected to the ground voltage; the PMOS transistor P4 having a source and a substrate to which the power supply voltage VDD is applied and a gate connected to the node B; the PMOS transistor P5 having a source connected to a drain of the PMOS transistor P4 and a gate connected to the node C; and the NMOS transistor N5 having a drain connected to a drain of the PMOS transistor P5, a gate connected to the node C, and a source and a substrate connected to the ground voltage. A high voltage detecting signal VDET is generated at the drain of the NMOS transistor N5.

The control voltage and floating well voltage generating circuit 110 comprises: the NMOS transistor N7 having a gate to which the high voltage detecting signal VDET is applied, a source and a substrate connected to the ground voltage; the NMOS transistor N6 having a gate to which the power supply voltage VDD is applied, a source connected to a drain of the NMOS transistor N7, and a substrate connected to the ground voltage; the PMOS transistor P7 having a source(drain) to which the power supply voltage VDD is applied, a gate connected to the drain of the NMOS transistor N6, and a substrate to which the floating well voltage VFW is applied; the PMOS transistor P6 having a gate to which the power supply voltage VDD is applied, a drain (source) and a source(drain) connected between the gate of the PMOS transistor P7 and a pad 20, and a substrate to which the floating well voltage VFW is applied; and the PMOS transistor P8 having a source(drain) connected to the drain(source) of the PMOS transistor P7, a gate to which the power supply voltage VDD is applied, a drain(source) connected to the pad 20, and a substrate to which the floating well voltage VFW is applied. A control voltage CON is generated at the source(drain) of the PMOS transistor P6.

The high voltage detecting reset circuit 120 comprises: the NMOS transistor N8 having a gate to which the power supply voltage VDD is applied, a substrate connected to the ground voltage, and a drain(source) connected to the pad 20; the PMOS transistor P9 having a source and a substrate to which the power supply voltage VDD is applied, and a gate connected to the pad 20; the PMOS transistor P10 having a source connected to a drain of the PMOS transistor P9, a gate connected to the drain(source) of the NMOS transistor N8, and a substrate to which the power supply voltage VDD is applied; and the NMOS transistor N9 having a gate connected to the drain(source) of the NMOS transistor N8, a drain connected to a drain of the PMOS transistor P10, and a source and a substrate connected to the ground voltage. A high voltage reset signal VRE is generated through the drain of the NMOS transistor N9.

Figure 4:
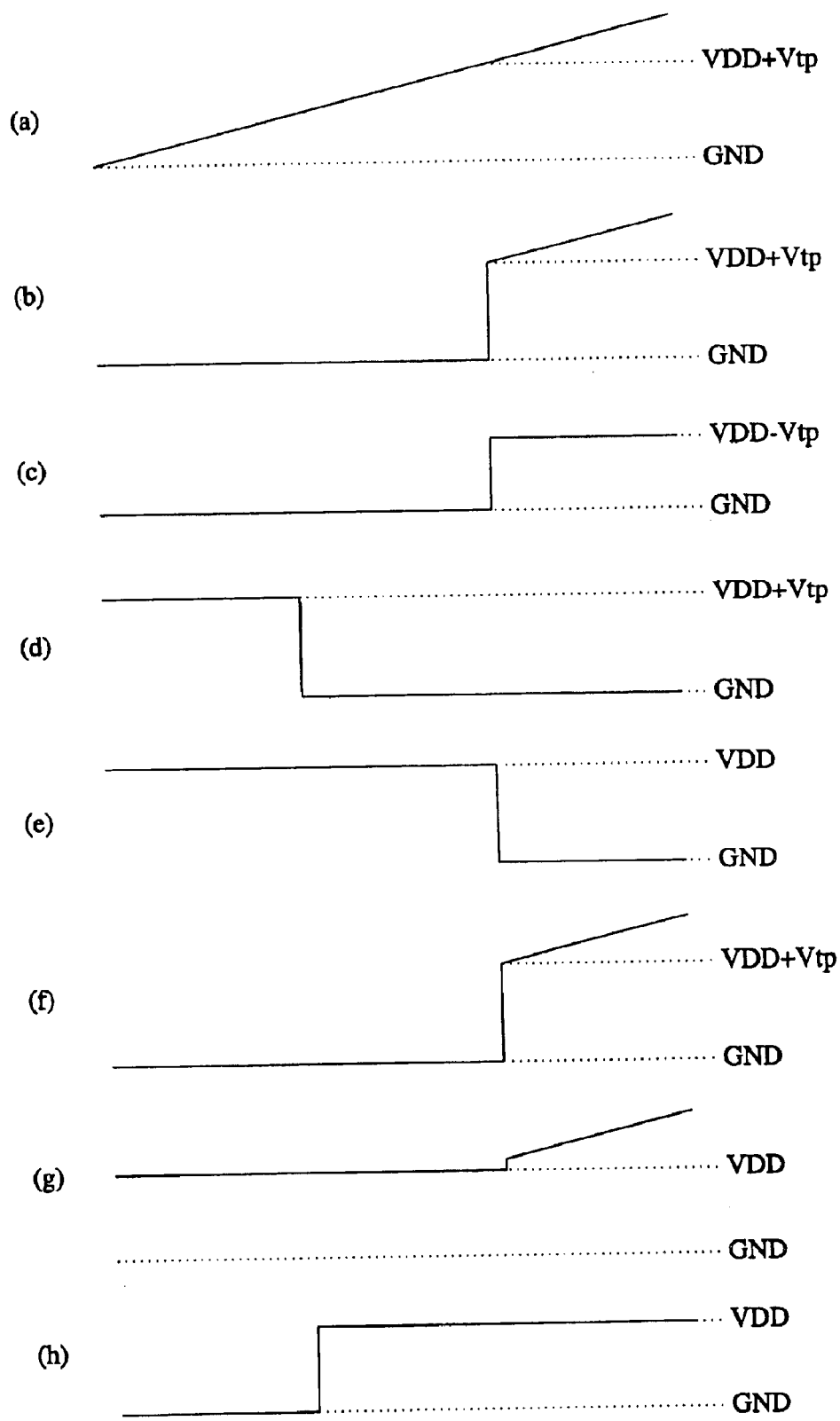
FIG. 4 illustrates voltage changes of various nodes of the circuit, in accordance with a change in voltage applied to a pad of the circuit shown in FIG. 3.

FIG. 4 illustrates the voltage response of each node in accordance with a change of a voltage applied to a pad of the circuit shown in FIG. 3, and wherein (a) refers to the voltage change at pad 20, (b) refers to the voltage change at node B, (c) refers to voltage change at node C, (d) refers to the voltage change of the high voltage detecting reset signal VRE, (e) refers to the voltage change of the high voltage detecting signal VDET, (f) refers to the voltage change of the control voltage CON, (g) refers to the voltage change of the floating well voltage VFW, and (h) refers to the voltage change of the input signal IN.

In FIG. 4, a reference denoted as GND indicates a ground voltage level.

The operation of a circuit shown in FIG. 3 is described as follows with reference to FIG. 4.

As shown in waveform (a) of FIG. 4, after a power supply voltage VDD is applied to the circuit, when a voltage between a ground voltage level to a voltage less than the sum of voltages VDD+Vtp, adding the power supply voltage VDD to a threshold voltage Vtp of the PMOS transistor P3, is applied to the pad 20, the PMOS transistor P3 is turned off. As shown in waveform (b) of FIG. 4, the node B remains at a ground voltage level and the NMOS transistor N8 transmits the voltage applied to the pad 20. At this time, until a voltage transmitted through the NMOS transistor N8 reaches a trip voltage of the PMOS transistor P10 and the NMOS transistor N9, the PMOS transistors P9 and P10 are turned on and the NMOS transistor N9 is turned off. Therefore, as shown in waveform (d) of FIG. 4, the high voltage detecting reset signal VRE is generated at a level of the power supply voltage VDD. However, if the voltage transmitted through the NMOS transistor N8 is greater than the trip voltage of the PMOS transistor P10 and the NMOS transistor N9, the PMOS transistors P9 and P10 are turned off and the NMOS transistor N9 is turned on. Thus, as shown in waveform (d) of FIG. 4, the high voltage detecting reset signal VRE of a ground voltage level is generated. When the high voltage detecting reset signal VRE of the power supply voltage VDD level is generated, the NMOS transistor N4 is turned on. So, as shown in waveform (c) of FIG. 4, the voltage of the node C becomes the ground voltage level. As a result, the PMOS transistors P4 and P5 are turned on, therefore, a high voltage detecting signal VDET is generated at the power supply voltage VDD level, as shown in waveform (e) of FIG. 4. When a high voltage detecting signal VDET is generated at the power supply voltage VDD level, the NMOS transistor N7 is turned on, and a control voltage CON is generated at the ground voltage level, as shown in waveform (f) of FIG. 4. When the PMOS transistor P7 is turned on and the PMOS transistors P6 and P8 are turned off, and a floating well voltage VFW is generated at the power supply voltage VDD level, as shown in waveform (g) of FIG. 4. The PMOS transistor P2 is turned on and pulls up the pad 20 to the power supply voltage level. The NMOS transistor N2 transmits the voltage of the pad 20. If a voltage of a signal transmitted through the NMOS transistor N2 reaches a trip voltage of the buffer BUF2, the buffer BUF2 generates the input signal IN at the power supply voltage VDD level, as shown in waveform (h) of FIG. 4.

In other words, after the power supply voltage VDD is applied to the circuit, when a voltage smaller than a level of the voltage VDD+Vtp is applied to the pad 20, the high voltage detecting signal VDET, the high voltage detecting reset signal VRE, and the floating well voltage VFW of the power supply voltage VDD level are generated. Therefore, the PMOS transistor P2, which is a pull-up means, is turned on and pulls up the pad 20 to the power supply voltage VDD level. Accordingly, it is possible to prevent leakage current from being generated through the input buffer connected to an internal pad of an external device, since the internal pad of the external device connected to the pad 20 is placed in a floating state.

In the meantime, while the power supply voltage VDD is applied to the circuit, and assuming a voltage greater than the level of the voltages VDD+Vtp is applied to the pad 20, as shown in waveform (a) of FIG. 4, the PMOS transistor P3 is turned on, and then a voltage of the pad 20 is transmitted to the node B, as shown in waveform (b) of FIG. 4.

In addition, as shown in waveform (c) of FIG. 4, the NMOS transistor N3 causes node C to change to the voltage VDD−Vtn by transmitting the voltage of node B. The NMOS transistor N8 transmits the voltage of the pad 20, and the NMOS transistor N9 is turned on in response to the signal transmitted through the NMOS transistor N8, thereby generating the high voltage detecting reset signal VRE at the ground voltage level, as shown in waveform (d) of FIG. 4. The NMOS transistor N4 is turned off, and the NMOS transistor N5 is turned on in response to the voltage of the node C, thereby generating the high voltage detecting signal VDET at the ground voltage level, as shown in waveform (e) of FIG. 4. Accordingly, the NMOS transistor N7 and the PMOS transistor P7 are turned off, and the PMOS transistors P6 and P8 are turned on, thereby generating the control voltage CON and the floating well voltage VFW having the same voltage level as the voltage applied to the pad 20, as shown in waveforms (f) and (g) of FIG. 4. The PMOS transistor P2 is turned off and the NMOS transistor N2 transmits the voltage of the pad 20. The buffer BUF2 generates the input signal IN of the power supply voltage VDD level in response to a voltage transmitted to the NMOS transistor N2, as shown in waveform (h) of FIG. 4.

That is, after the power supply voltage VDD is applied to the circuit, when a voltage greater than the level of the combined voltages VDD+Vtp is applied to the pad 20, the high voltage detecting signal VDET and the high voltage detecting reset signal VRE are generated at a ground voltage level. In addition, the floating well voltage VFW and the control voltage CON are generated at the same level as the voltage applied to the pad 20. Consequently, when a high voltage is applied to the pad 20, the PMOS transistor P2 is protected by turning off the PMOS transistor P2, the pull-up means.

In this manner, as for the input buffer of the present invention, it is possible to prevent a leakage current through the input buffer connected to the pad of the external device by pulling up the pad to the power supply voltage level, in the case where the pad is in a floating state.

In addition, the input buffer of the present invention can protect the pull-up means from an applied high voltage by sensing the applied high voltage and turning off the pull-up means, when the high voltage is applied to the pad.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An input buffer, comprising:
    a single pull-up transistor connected between a power supply voltage and an input pad and having a gate to which a control voltage is applied, and having a substrate to which a floating well voltage is applied;
    a transmission transistor having a gate to which the power supply voltage is applied and a substrate connected to a ground voltage, and transmitting at an output terminal a signal applied to the input pad;
    a buffer having an input terminal coupled directly and exclusively to the output terminal of the transmission transistor, the buffer generating an input signal by buffering the signal transmitted by the transmission transistor; and
    a controller generating the voltage of the signal applied to the input pad as the control voltage and the floating well voltage when a high voltage is applied to the input pad, and generating the ground voltage as the control voltage and the power supply voltage as the floating well voltage in the case where a voltage less than the high voltage is applied to the input pad.

2. The input buffer of claim 1, wherein the high voltage is greater than the power supply voltage.

3. The input buffer of claim 1, wherein the controller comprises:
    a high voltage detecting circuit generating a high voltage detecting signal when the high voltage is applied to the input pad;
    a high voltage detecting reset circuit generating a high voltage detecting reset signal for resetting the high voltage detecting signal, when the voltage less than the high voltage is applied to the input pad; and
    a control voltage and floating well voltage generating circuit generating the voltage applied to the input pad as the control voltage and the floating well voltage when the high voltage detecting signal is generated, and generating the ground voltage as the control voltage and the power supply voltage as the floating well voltage when the high voltage detecting signal is reset.

4. The input buffer of claim 3, wherein the high voltage detecting circuit comprises:
    a first PMOS transistor connected between the input pad and a first node and having a gate to which the power supply voltage is applied, and having a substrate to which the floating well voltage is applied;
    a first NMOS transistor connected between the first node and a second node and having a gate to which the power supply voltage is applied, and having a substrate to which the ground voltage is applied;
    a second NMOS transistor having a drain connected to the second node, a gate to which the high voltage detecting reset signal is applied, and a source and a substrate connected to the ground voltage;
    a second PMOS transistor having a source and a substrate connected to the power supply voltage, and a gate connected to the first node;
    a third PMOS transistor having a source connected to a drain of the second PMOS transistor, a gate connected to the second node, and a substrate connected to the power supply voltage; and
    a third NMOS transistor having a gate connected to the second node, a drain connected to a drain of the third PMOS transistor, and a source and a substrate connected to the ground voltage; and
    wherein the high voltage detecting signal is generated at the drain of the third PMOS transistor.

5. The input buffer of claim 3, wherein the high voltage detecting reset circuit comprises:
    a first NMOS transistor connected between the input pad and a first node and having a gate to which the power supply voltage is applied, and having a substrate connected to the ground voltage;
    a first PMOS transistor having a source and a substrate to which the power supply voltage is applied, and a gate connected to the input pad;
    a second PMOS transistor having a source connected to a drain of the first PMOS transistor, a substrate to which the power supply voltage is applied, and a gate connected to the first node; and
    a second NMOS transistor having a drain connected to a drain of the second PMOS transistor, a gate connected to the first node, and a source and a substrate connected to the ground voltage; and
    wherein the high voltage detecting reset signal is generated at the drain of the fifth PMOS transistor.

6. The input buffer of claim 3, wherein the control voltage and floating well voltage generating circuit comprises:
    a first PMOS transistor having one of a source and drain to which the power supply voltage is applied, a gate connected to a first node, and the other of the drain and source and a substrate to which the floating well voltage is applied;
    a second PMOS transistor having one of a source and drain connected to the first node, a gate to which the power supply voltage is applied, the other of the drain and source connected to the input pad, and a substrate to which the floating well voltage is applied;
    a third PMOS transistor having one of a source and drain and a substrate to which the floating well voltage is applied, the other of the source and drain connected to the input pad, and a gate to which the power supply voltage is applied;
    a first NMOS transistor having a gate to which the power supply voltage is applied, a drain connected to the first node, and a substrate connected to the ground voltage; and
    a second NMOS transistor having a drain connected to a source of the first NMOS transistor, a gate to which the high voltage detecting signal is applied, a substrate and a source connected to the ground voltage; and wherein the control voltage is generated at the first node and the floating well voltage is generated at the one of the drain and source of the first PMOS transistor.

7. An input buffer, comprising:

a single pull-up transistor connected between a power supply voltage and an input pad;

a transmission transistor having a gate to which the power supply voltage is applied and a substrate connected to a ground voltage, and transmitting at an output terminal a signal applied to the input pad;

a buffer having an input terminal coupled directly and exclusively to the output terminal of the transmission transistor, the buffer generating an input signal by buffering the signal transmitted by the transmission transistor; and a controller turning off the single pull-up transistor when a high voltage is applied to the input pad, and turning on the single pull-up transistor in the case where a voltage less than the high voltage is applied to the input pad.

8. The input buffer of claim 7, wherein the controller comprises:

a high voltage detecting circuit generating a high voltage detecting signal when the high voltage is applied to the input pad, and resetting the high voltage detecting signal in the case where a voltage less than the high voltage is applied to the input pad; and a control voltage and floating well voltage generating circuit applying a voltage applied to the input pad to a gate and a substrate of the pull-up transistor when the high voltage detecting signal is generated, and applying the ground voltage and the power supply voltage to the gate and the substrate of the pull-up transistor in the case where the high voltage detecting signal is reset.

9. The input buffer of claim 8, wherein the high voltage detecting circuit comprises:

a high voltage detecting circuit generating a high voltage detecting signal when a high voltage is applied to the input pad; and a high voltage detecting reset circuit generating a high voltage detecting reset signal for resetting the high voltage detecting signal, in the case where a voltage less than the high voltage is applied to the input pad.

10. The input buffer of claim 9, wherein the high voltage detecting circuit comprises:

a first PMOS transistor connected between the input pad and a first node and having a gate to which the power supply voltage is applied, and having a substrate to which the floating well voltage is applied;

a first NMOS transistor connected between the first node and a second node and having a gate to which the power supply voltage is applied, and having a substrate to which a ground voltage is applied;

a second NMOS transistor having a drain connected to the second node, a gate to which the high voltage detecting reset signal is applied, and a source and a substrate connected to the ground voltage;

a second PMOS transistor having a source and a substrate connected to the power supply voltage, and a gate connected to the first node;

a third PMOS transistor having a source connected to a drain of the second PMOS transistor, a gate connected to the second node, and a substrate connected to the power supply voltage; and a third NMOS transistor having a gate connected to the second node, a drain connected to a drain of the third PMOS transistor, and a source and a substrate connected to the ground voltage; and wherein the high voltage detecting signal is generated at the drain of the third PMOS transistor.

11. The input buffer of claim 9, wherein the high voltage detecting reset circuit comprises:

a first NMOS transistor connected between the input pad and a first node and having a gate to which the power supply voltage is applied, and having a substrate connected to the ground voltage;

a first PMOS transistor having a source and a substrate to which the power supply voltage is applied, and a gate connected to the input pad;

a second PMOS transistor having a source connected to a drain of the first PMOS transistor, a substrate to which the power supply voltage is applied, and a gate connected to the first node; and a second NMOS transistor having a drain connected to a drain of the second PMOS transistor, a gate connected to the first node, and a source and a substrate connected to the ground voltage; and wherein the high voltage detecting reset signal is generated at the drain of the fifth PMOS transistor.

12. The input buffer of claim 8, wherein the control voltage and floating well voltage generating circuit comprises:

a first PMOS transistor having one of a source and drain to which the power supply voltage is applied, a gate connected to a first node, the other of the drain and source to which the floating well voltage is applied, and a substrate;

a second PMOS transistor having one of a source and drain connected to the first node, a gate to which the power supply voltage is applied, the other of the drain and source connected to the input pad, and a substrate to which the floating well voltage is applied;

a third PMOS transistor having one of a source and drain and a substrate to which the floating well voltage is applied, the other of the source and drain connected to the input pad, and a gate to which the power supply voltage is applied;

a first NMOS transistor having a gate to which the power supply voltage is applied, a drain connected to the first node, and a substrate connected to the ground voltage; and a second NMOS transistor having a drain connected to a source of the first NMOS transistor, a gate to which the high voltage detecting signal is applied, and a substrate and a source connected to the ground voltage; and wherein the control voltage is generated through the first node and the floating well voltage is generated through the drain or source of the first PMOS transistor.

* * * * *